United States Patent
Srinivasan et al.

(10) Patent No.: US 10,802,077 B1
(45) Date of Patent: Oct. 13, 2020

(54) TEST CIRCUIT FOR DYNAMIC CHECKING FOR FAULTS ON FUNCTIONAL AND BIST CLOCK PATHS TO MEMORY IN BOTH ATPG AND LBIST MODES

(71) Applicant: STMicroelectronics International N.V., Plan-les-Ouates, Geneva (CH)

(72) Inventors: Venkata Narayanan Srinivasan, Greater Noida (IN); Shiv Kumar Vats, Greater Noida (IN); Himanshu, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 16/387,809

(22) Filed: Apr. 18, 2019

(51) Int. Cl.
*G01R 31/3185* (2006.01)
*G01R 31/3183* (2006.01)
*G01R 31/3187* (2006.01)

(52) U.S. Cl.
CPC . *G01R 31/318552* (2013.01); *G01R 31/3187* (2013.01); *G01R 31/318307* (2013.01); *G01R 31/318536* (2013.01); *G01R 31/318547* (2013.01)

(58) Field of Classification Search
CPC ........ G01R 31/3187; G01R 31/318552; G01R 31/318307; G01R 31/318547; G01R 31/318538; G11C 29/40; G11C 29/50012
See application file for complete search history.

(56) References Cited

U.S. PATENT DOCUMENTS

| | | | | |
|---|---|---|---|---|
| 7,383,481 B2 * | 6/2008 | Warren | .......... | G01R 31/318552 714/25 |
| 7,444,560 B2 * | 10/2008 | Nguyen | .......... | G01R 31/31721 365/201 |
| 2012/0198294 A1 * | 8/2012 | Nadeau-Dostie | .......... | G11C 29/50012 714/719 |
| 2014/0032986 A1 * | 1/2014 | Wan | .......... | G11C 29/40 714/727 |
| 2015/0338460 A1 * | 11/2015 | Sofer | .......... | G01R 31/318575 714/727 |

* cited by examiner

*Primary Examiner* — Shelly A Chase
(74) *Attorney, Agent, or Firm* — Crowe & Dunlevy

(57) ABSTRACT

A test circuit includes a BIST clock generator and a functional clock generator. A first multiplexer selectively passes the BIST clock or the functional clock as a selected clock in response to a clock selection signal. BIST logic operates based upon the BIST clock. Functional logic operating based upon the functional clock signal. A memory operates based upon the selected clock. When the test circuit is operating in BIST mode, a clock selection circuit receives and passes a BIST signal as the clock selection signal. When the test circuit is operating in a shift phase of a scan test mode, it generates the clock selection signal as asserted, and when the test circuit is operating in the capture phase of the scan test mode, it generates the clock signal as equal to a last bit received from a scan chain.

15 Claims, 3 Drawing Sheets

TEST CIRCUIT FOR DYNAMIC CHECKING FOR FAULTS ON FUNCTIONAL AND BIST CLOCK PATHS TO MEMORY IN BOTH ATPG AND LBIST MODES

TECHNICAL FIELD

This application is directed to the field of device testing, and in particular, to a test circuit capable of testing both built-in self test (BIST) and functional clock and data paths during scan testing.

BACKGROUND

Despite advances in semiconductor processing and manufacturing technology, integrated circuits are still manufactured with errors. Unfortunately, a single error can render an integrated circuit unusable. Accordingly, various techniques to identify faults in integrated circuits have been developed.

A known test circuit for performing testing operations is shown in FIG. 1. The test circuit 1 includes built-in self test (BIST) logic 4, functional logic 6, and a memory 5. The BIST logic 4 contains a flop chain 7, the functional logic 6 contains a flop chain 8, and the memory 5 contains a flop chain 9. The phrase "flop chain" is understood by those skilled in the art to mean a chain of serially connected flip flops of suitable type. An on chip clock 2 provides a CLK signal that is distributed through a clock tree to the BIST logic 4, memory 5, and functional logic 6.

One form of testing that may be performed using the test circuit 1 is scan testing, which includes a shift phase and a capture phase. In the shift phase, the flop chains 7, 9, and 8 are serially connected in a scan chain. The path of data flow through the scan chain in the shift phase is shown, with its output labeled as SHIFT PATH for ease of understanding.

In the capture phase, the flop chains 7 and 8 are not connected to one another, and instead each provides the outputs of each of their individual flip flops to the memory 5, or each of their individual flip flops receives input from the memory 5. This connection between the inputs or outputs of the flip flops of the flop chain 7 and the memory 5, and between the inputs or outputs of the flip flops of the flop chain 8 and memory 5, is labeled as CAPTURE PATH for ease of understanding.

Due to the use of a single clock CLK for both the BIST logic 4 and the functional logic 6, the BIST logic 4 and functional logic 6 are to be balanced (e.g., capable of operating using the same clock signal CLK). This results in congestion on the CLK path to the BIST logic 4, but this must be done so as to meet the timing requirements imposed by the fact that the flop chains 7, 9, and 8 are serially connected. This situation is undesirable, leaving a desire for further development into the area of test circuits.

SUMMARY

Disclosed herein is a test circuit operable in a built-in self test (BIST) mode or a scan test mode. The test circuit includes a first clock generator generating a BIST clock, a second clock generator generating a functional clock, and a first multiplexer coupled to receive input from the first and second clock generators and selectively passing the BIST clock or the functional clock as a selected clock in response to a clock selection signal. Built-in self test (BIST) logic operates based upon the BIST clock, functional logic operates based upon the functional clock signal, and a memory operates based upon the selected clock. A clock selection circuit is configured to, when the test circuit is operating in the BIST mode, receive and pass a BIST signal as the clock selection signal. When the test circuit is operating in the scan test mode and when the scan test mode is in a shift phase, the clock selection circuit is configured to generate the clock selection signal as being asserted. When the test circuit is operating in the scan test mode and when the scan test mode is in a capture phase, the clock selection circuit is configured to generate the clock signal as equal to a last bit received from a scan chain in which flip flop 53 present. This scan chain may be formed from flip flops of the BIST logic, memory, and functional logic, or, may be a differently formed scan chain.

Note that a scan enable signal is asserted when the test circuit is operating in the shift phase of the scan test mode and deasserted when the test circuit is operating in the capture phase of the scan test mode, and that a scan test signal is asserted when the test circuit is operating in the scan test mode and is deasserted when the test circuit is operating in the BIST mode. Keeping this in mind, the clock selection circuit may include a selection circuit configured to receive a scan chain pattern from the scan chain when the scan enable signal is asserted, and to output a last received bit of the scan chain pattern when the scan enable signal is deasserted. The clock selection circuit may include a second multiplexer configured to pass the last received bit of the scan chain pattern as the clock selection signal when the scan enable signal is deasserted and the scan test signal is asserted, and to pass a received test pattern as the clock selection signal when the scan test signal is deasserted.

The selection circuit of the clock selection circuit may include a third multiplexer configured to pass the scan chain pattern when the scan enable signal is asserted and to pass a feedback signal when the scan enable signal is deasserted, and a flip flop having an input coupled to an output of the third multiplexer, and having an output generating the feedback signal. An OR gate is configured to perform a logical OR operation on the scan enable signal and the feedback signal so that when the scan enable signal is deasserted, the OR gate outputs the feedback signal, the feedback signal being the last received bit of the scan chain pattern when the scan enable signal is asserted.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
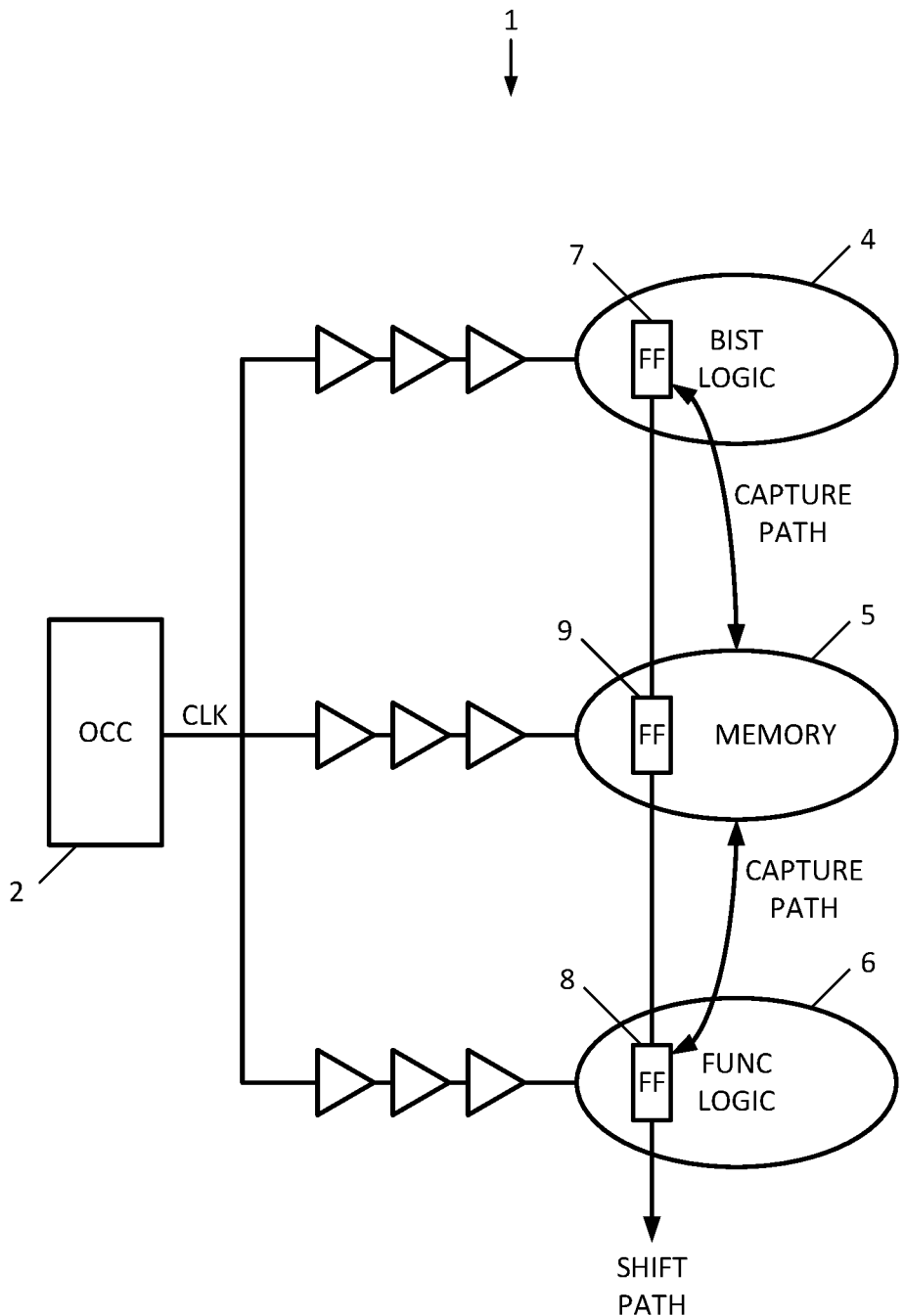
FIG. 1 is a block diagram of test circuitry for a device under test in which BIST logic and functional logic operate in the same clock domain.
Figure 2:
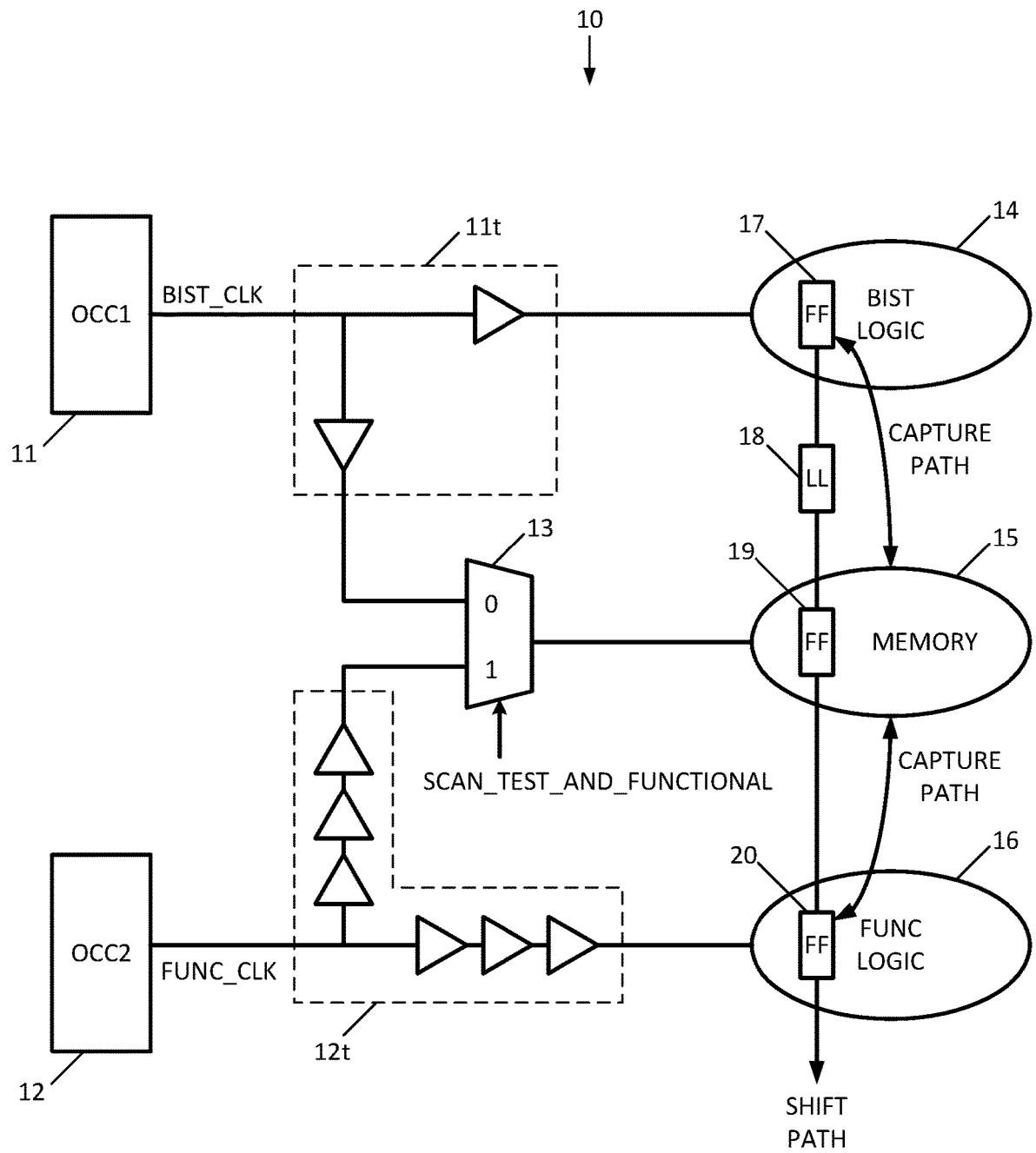
FIG. 2 is a block diagram of test circuitry for a device under test in which BIST logic and functional logic operate in different clock domains, in which scan testing can performed with a functional clock domain.

Test circuitry 10 for a device under test is now described with reference to FIG. 2. The test circuitry 10 includes built-in self test (BIST) logic 14, functional logic 16, and a memory 15. The BIST logic 14 contains a flop chain 17, the functional logic 16 contains a flop chain 20, and the memory 15 contains a flop chain 19. In this context, a "flop chain" is understood by those skilled in the art to be a chain of serially connected flip flops of suitable type.

The BIST logic 14 is operates based upon a BIST clock signal BIST_CLK generated by a first on chip clock (OCC1) source 11 and distributed by a clock tree 11*t*, while the functional logic 16 operates based upon a functional clock signal FUNC_CLK generated by a second on chip clock (OCC2) source 12 and distributed by a clock tree 12*t*. The clock tree 11*t* for the first on chip clock source 11 also provides the BIST_CLK to a first input of a multiplexer 13, and the clock tree 12*t* for the second on chip clock source 12 also provides the FUNC_CLK to a second input of the multiplexer 13. The selection signal for the multiplexer 13 is a SCAN_TEST_AND_FUNCTIONAL signal, which is high (e.g., a logic "1") when scan testing is being performed or in application mode, and which is low (e.g., a logic "0") when scan testing is not being performed or not in application mode. Therefore, when the SCAN_TEST_AND_FUNCTIONAL signal is high and scan testing is being performed, the multiplexer 13 provides the FUNC_CLK to the memory 15 and the memory operates based upon FUNC_CLK in scan testing. Conversely, when the SCAN_TEST_AND_FUNCTIONAL signal is low and scan testing is not being performed and also not in application mode, the multiplexer 13 provides BIST_CLK to the memory 15 and the memory operates based upon BIST_CLK.

Scan testing includes a shift phase and a capture phase. In the shift phase, the flop chains 17, 19, and 20 are serially connected in a scan chain. Note the presence of a lock-up latch (LL) 18 between flop chains 17 and 19 to provide synchronization on account of the fact that during the shift phase, the flop chain 17 will operate based upon the BIST_CLK but the flop chains 19 and 20 will operate based upon the FUNC_CLK. The path of data flow through the scan chain in the shift phase is shown, with its output labeled as SHIFT PATH for ease of understanding.

In the capture phase, the flop chains 17 and 20 are not connected to one another, and instead each individual flip flop of the flop chains 17 and 20 provide their output to the memory 15 or take input from memory 15. This connection between the input or output of the flip flops of the flop chain 17 and the memory 15, and between the input or output of the flip flops of the flop chain 20 and memory, is labeled as CAPTURE PATH for ease of understanding.

It bears repeating that during scan testing, the SCAN_TEST_AND_FUNCTIONAL signal is high and the multiplexer 13 passes FUNC_CLK, so the memory 15 operates based upon FUNC_CLK. This means that scan testing with the test circuitry 10 is unable to detect faults on the BIST_CLK path (for example, faults of the clock tree 110 to the memory 15. This also means that at-speed testing cannot be performed on the data path between the BIST logic 14 and the memory 15. The result of this is that if there is a failure involving the BIST logic, there is no easy technique for ascertaining whether the failure originated in the BIST_CLK path to the memory 15 or whether the failure was with one or more cells of the memory 15 itself. Indeed, to determine the source of the failure, the functional logic 16 would then check each cell of the memory 15 with an at-speed test, increasing complexity and consuming time.

Figure 3:
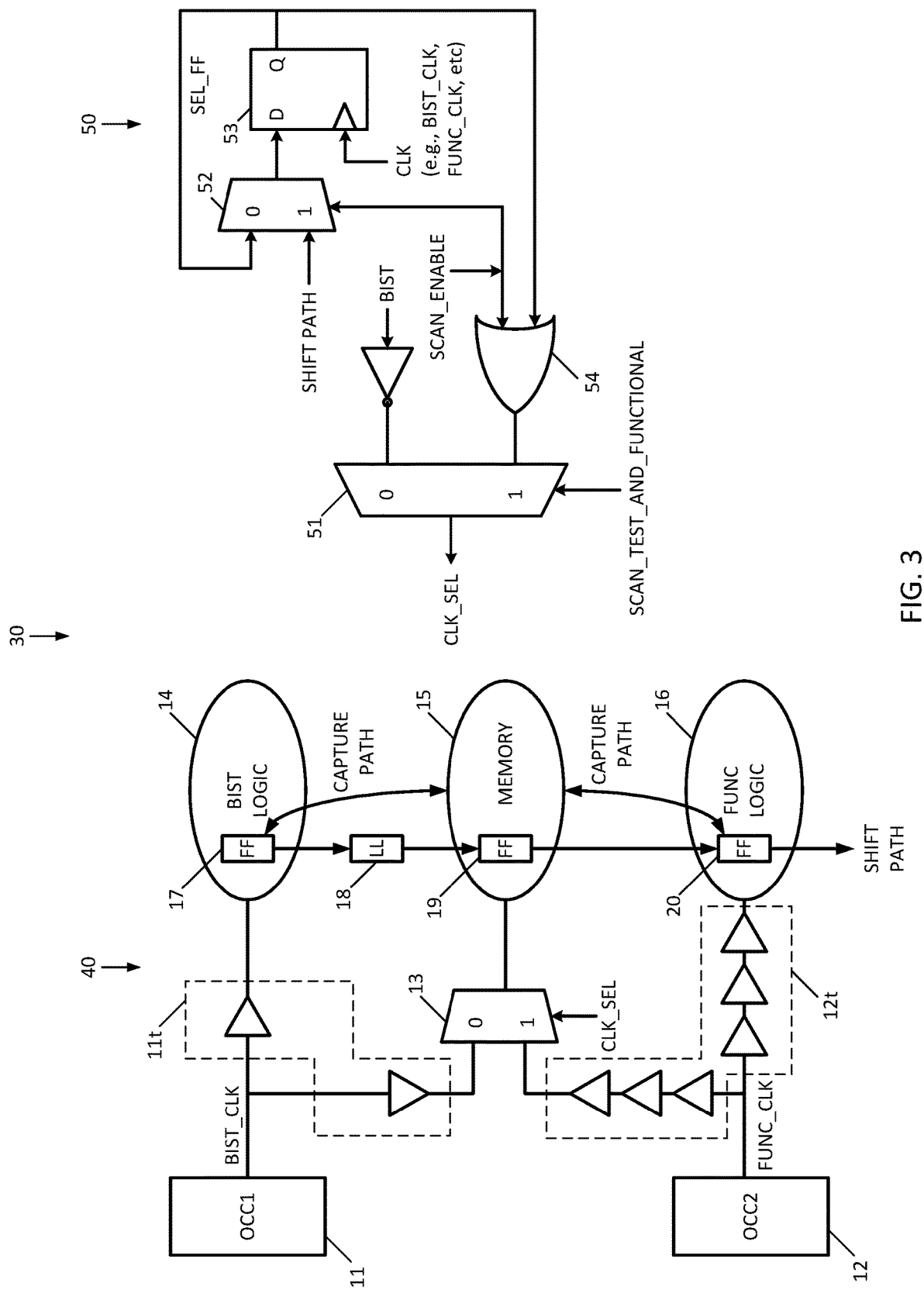
FIG. 3 is a block diagram of test circuitry for a device under test in which BIST logic and functional logic operate in different clock domains, in which scan testing can be performed with both a functional clock domain and a BIST clock domain.

The test circuitry 30 of FIG. 3 addresses this concern. Upon review, it will be noted that the test circuitry 30 includes a test circuit 40 that is substantially identical to the test circuit 10 of FIG. 2, with the exception being that the select signal for the multiplexer 13 is no longer the SCAN_TEST_AND_FUNCTIONAL signal, but is instead a clock select signal CLK_SEL. This clock select signal CLK_SEL is generated by clock select circuitry 50 from the SCAN_TEST_AND_FUNCTIONAL signal and the SCAN_ENABLE signal (indicating whether scan testing is in the shift phase or the capture phase, with a logic "1" indicating shift phase and a logic "0" representing capture phase).

In particular, the clock select circuitry 50 includes a multiplexer 51 having a first input coupled to receive the inverted BIST signal and a second input coupled to receive the output of an OR gate 54. The clock select circuitry 50 also includes a multiplexer 52 having a first input receiving a flop output signal SEL_FF from a flip flop 53 and a second input receiving a test pattern from the SHIFT PATH. Note that the selection signal for the multiplexer 52 is the SCAN_ENABLE signal, and that the SCAN_ENABLE signal is also received at a first input of the OR gate 54. The flip flop 53 receives the output of the multiplexer 52 at its input and has its output (generating SEL_FF) coupled to the first input of the multiplexer 52 as well as to a second input of the OR gate 54. The flip flop 53 is clocked by a clock signal that may be BIST_CLK, FUNC_CLK, or another suitable clock signal from automated test equipment (ATE), regardless of mode of operation of the test circuit 30.

As explained, the multiplexer 51 outputs the clock select signal CLK_SEL, and the select signal for the multiplexer 51 is the SCAN_TEST_AND_FUNCTIONAL signal described above which is high to indicate scan testing is being performed or that the device is in application mode and is low to indicate scan testing is not being performed or that the device is not in application mode. When the SCAN_TEST_AND_FUNCTIONAL signal is low, the inverted BIST_MODE signal received at the first input of the multiplexer 51 is passed as the CLK_SEL signal. Therefore, when not performing scan testing or when the device is not in application mode, the CLK_SEL signal is low and selecting the BIST_CLK for memory testing with the BIST logic.

When scan testing is being performed, the CLK_SEL signal is high during the shift phase, and the output of the OR gate 54 is passed as the CLK_SEL signal. If the SCAN_ENABLE signal is high to indicate the scan testing is in the shift phase, the output of the OR gate 54 (as applied to the second input of multiplexer 51) will be high regardless of other input received by the OR gate 54, and the CLK_SEL signal will therefore be high. Therefore, when scan testing is being performed and in the shift phase, the multiplexer 13 will pass FUNC_CLK to the memory 15 and the memory 15 will operate based thereupon.

Note that during the shift phase (e.g., the SCAN_ENABLE signal is high), the second input of the multiplexer 52 will receive the output from the SHIFT PATH. Since the select signal for the multiplexer 52 is the SCAN_ENABLE signal, at logic high during the shift phase, the multiplexer 52 will pass values from the SHIFT path, and the flip flop 53 will be continually loaded with values from the SHIFT PATH (e.g., values from the previous flop in the scan chain. Note that flip flop 53 is part of a scan chain, and can be part of the scan chain shown by SHIFT PATH (but may instead be part of a differently formed scan chain), therefore the flip flop 53 receives a value from a previous flop in its scan chain.)

When the capture phase is entered, the SCAN_ENABLE signal will go low, causing the multiplexer 52 to instead pass the output of the flip flop 53 which is input in feedback at the first input of multiplexer 52, labeled as the SEL_FF signal, back to the input of the flip flop 53. The result of this is that the SEL_FF signal output by the flip flop 53 remains constant with each cycle of the clock CLK during the capture phase.

As stated, in capture phase, SCAN_ENABLE is low and the SCAN_TEST_AND_FUNCTIONAL signal is high, TIONAL signal will be high, and flip flop 53 will be set to logical one at POR (power on reset). Since SCAN_ENABLE is low when scan testing is not being performed, the feedback path from flip flop 53 (i.e., the SEL_FF signal) will be passed through the multiplexer 52 to the flip flop 53, and the SEL_FF signal will be maintained as high; therefore, the CLK_SEL signal will be set high, and the memory 15 will receive the FDNC_CLK. Note that at power-up, the SEL_FF signal will be high.

For quick reference and ease of understanding of the drawings, below is a truth table for operation of the test circuit 30.

| MODE | SCAN_TEST_AND_FUNCTIONAL | CLK_SEL | Clock signal received by Memory 15 | COMMENTS |
|---|---|---|---|---|
| Application mode (functional mode) | '1' | '1' | FUNC_CLK | SEL_FF will remain '1' in application mode. SEL_FF set to '1' at power-up. SCAN_ENABLE = '0' in application mode, so SEL_FF will remain '1' |
| BIST mode | '0' | '0' | BIST_CLK | CLK_SEL = inverted value of BIST |
| SCAN mode (shift phase) | '1' | '1' | FUNC_CLK | As SCAN_ENABLE = '1' |
| SCAN mode (capture phase) | '1' | SEL_FF value | BIST_CLK/ FUNC_CLK | BIST_CLK when SEL_FF = '0', FUNC_CLK when SEL_FF = '1' | while the SEL_FF signal remains constant. Therefore, in capture phase, the SEL_FF signal is passed through OR gate 54, and is passed by the multiplexer 51 as the CLK_SEL signal. Since the value of the SEL_FF signal remains stable in the capture phase, the CLK_SEL signal will then cause the multiplexer 13 to pass either the BIST_CLK or FUNC_CLK depending upon the value present in the SEL_FF signal at the end of the shift phase and which is held throughout the capture phase.

Accordingly, note that during scan testing, the memory 15 is switched between operating based on the BIST_CLK and FUNC_CLK depending on the pattern loaded into the scan chain. This means that faults on both the FUNC_CLK path and the BIST_CLK path are checked during a single pass of scan testing, and that faults on both the data path between the BIST logic 14 and memory 15 and the functional logic 16 and memory 15 are also checked during a single pass of test scan testing.

Regarding the testing of the data path between the BIST logic 14 and memory 15, this occurs when the CLK_SEL signal is low during at-speed testing. Regarding the testing of the BIST_CLK path, this occurs implicitly when the CLK_SEL signal is low and the data path is checked at-speed. In the fault list, data path faults will be seen in a category labeled as DS (detected by simulation) and clock path faults will be seen in category labeled as DI (detected by implication).

Accordingly from the above, note that during scan testing, the memory 15 is dynamically switched between operating based on BIST_CLK and FUNC_CLK depending on the pattern loaded into the scan chain, and that during BIST testing, the memory 15 is checked with BIST_CLK.

When not in scan testing or not in BIST testing (i.e., in application mode), the SCAN_TEST_AND_FUNC- While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A test circuit operable in a built-in self test (BIST) mode or a scan test mode, the test circuit comprising:
   a first clock generator generating a BIST clock;
   a second clock generator generating a functional clock;
   a first multiplexer coupled to receive input from the first and second clock generators and configured to selectively pass the BIST clock or the functional clock as a selected clock in response to a clock selection signal;
   built-in self test (BIST) logic clocked by the BIST clock;
   functional logic clocked by the functional clock;
   memory clocked by the selected clock; and
   a clock selection circuit configured to:
     when the test circuit is operating in the BIST mode, receive and pass a BIST signal as the clock selection signal; and
     when the test circuit is operating in the scan test mode:
       when the scan test mode is in a shift phase, generate the clock selection signal as being asserted; and
       when the scan test mode is in a capture phase, generate the clock selection signal as equal to a last bit received from a scan chain.

2. The test circuit of claim 1, wherein a scan enable signal is asserted when the test circuit is operating in the shift phase of the scan test mode and deasserted when the test circuit is operating in the capture phase of the scan test mode; wherein a scan test signal is asserted when the test circuit is operating in the scan test mode and is deasserted when the test circuit is operating in the BIST mode; and wherein the clock selection circuit comprises:
   a selection circuit configured to receive a scan chain pattern from the scan chain when the scan enable signal is asserted, and to output a last received bit of the scan chain pattern when the scan enable signal is deasserted; and
   a second multiplexer configured to pass the last received bit of the scan chain pattern as the clock selection signal when the scan enable signal is deasserted and the scan test signal is asserted, and to pass a received test pattern as the clock selection signal when the scan test signal is deasserted.

3. The test circuit of claim 2, wherein the selection circuit of the clock selection circuit comprises:
   a third multiplexer configured to pass the scan chain pattern when the scan enable signal is asserted and to pass a feedback signal when the scan enable signal is deasserted;
   a flip flop having an input coupled to an output of the third multiplexer, and having an output generating the feedback signal; and
   an OR gate configured to perform a logical OR operation on the scan enable signal and the feedback signal so that when the scan enable signal is deasserted the OR gate outputs the feedback signal, the feedback signal being the last received bit of the scan chain pattern when the scan enable signal is asserted.

4. The test circuit of claim 2, wherein the test pattern comprises the BIST signal.

5. The test circuit of claim 2, wherein the test pattern comprises a logical complement of the BIST signal.

6. A circuit, comprising:
   a first multiplexer configured to selectively pass a BIST clock or a functional clock in response to a clock selection signal; and
   a clock selection circuit comprising:
      a second multiplexer configured to selectively pass a bit received from a scan chain or a flop output signal in response to a scan enable signal;
      a flip flop configured to latch an output signal received from the second multiplexer to an output of the flip flop in response to assertion of a clock signal, wherein the output of the flip flop generates the flop output signal;
      a logical OR gate configured to receive input from the scan enable signal and the flop output signal; and
      a third multiplexer configured to selectively pass a test pattern or an output of the logical OR gate as the clock selection signal in response to a scan testing signal.

7. The circuit of claim 6,
   wherein the clock selection signal passed by the third multiplexer is based upon the test pattern when the scan testing signal is in a first logic state;
   wherein the clock selection signal passed by the third multiplexer is asserted when the scan enable signal is asserted and when the scan testing signal is in a second logic state; and
   wherein the clock selection signal passed by the third multiplexer is based upon the bit received from the scan chain and latched as the flop output signal by the flip flop, when the scan enable signal is deasserted and when the scan testing signal is in the second logic state.

8. The circuit of claim 6, wherein the test pattern comprises a BIST signal.

9. The circuit of claim 6, wherein the test pattern comprises a logical complement of a BIST signal.

10. A test circuit operable in a built-in self test (BIST) mode or a scan test mode, the test circuit comprising:
   a first clock generator configured to generate a BIST clock;
   a second clock generator configured to generate a functional clock;
   a first multiplexer coupled to receive input from the first and second clock generators and configured to selectively pass one of the BIST clock or the functional clock as a selected clock in response to a clock selection signal;
   built-in self test (BIST) logic clocked by the BIST clock;
   functional logic clocked by the functional clock;
   memory clocked by the selected clock; and
   a clock selection circuit comprising:
      a second multiplexer configured to selectively pass one of:
         a bit received from a scan chain, or
         a flop output signal in response to a scan enable signal;
      a flip flop configured to latch an output signal received from the second multiplexer to an output of the flip flop in response to assertion of a clock signal, wherein the output of the flip flop generates the flop output signal;
      a logic gate configured to receive input from the scan enable signal and the flop output signal; and
      a third multiplexer configured to selectively pass one of a BIST signal or output from the logic gate as the clock selection signal in response to a scan testing signal.

11. The test circuit of claim 10, wherein the logic gate comprises an OR gate.

12. The test circuit of claim 10, wherein the BIST signal is a logically complemented version of a test pattern.

13. A circuit, comprising:
   a first multiplexer configured to selectively pass a bit received from a scan chain or a flop output signal in response to a scan enable signal;
   a flip flop configured to latch an output signal received from the first multiplexer to an output of the flip flop in response to assertion of a clock signal, wherein the output of the flip flop generates the flop output signal;
   a logic gate configured to receive input from the scan enable signal and the flop output signal; and
   a second multiplexer configured to selectively pass one of a test pattern or output of the logic gate as a clock selection signal in response to a scan testing signal.

14. The circuit of claim 13, wherein the logic gate comprises an OR gate.

15. The circuit of claim 13, wherein the test pattern comprises a logically complemented version of a BIST signal.

* * * * *

UNITED STATES PATENT AND TRADEMARK OFFICE
CERTIFICATE OF CORRECTION

PATENT NO. : 10,802,077 B1
APPLICATION NO. : 16/387809
DATED : October 13, 2020
INVENTOR(S) : Venkata Narayanan Srinivasan et al.

Page 1 of 1

It is certified that error appears in the above-identified patent and that said Letters Patent is hereby corrected as shown below:

In the Specification

At Column 3, Line 60, please replace [[ clock tree 110 ]] with -- clock tree 11t --.

Signed and Sealed this
Eighth Day of June, 2021

Drew Hirshfeld
*Performing the Functions and Duties of the
Under Secretary of Commerce for Intellectual Property and
Director of the United States Patent and Trademark Office*